United States Patent
Riches (10) Patent No.: US 8,493,251 B2
(45) Date of Patent: Jul. 23, 2013

(54) SELF-CALIBRATED DAC WITH REDUCED GLITCH MAPPING

(75) Inventor: James J. Riches, Chandler, AZ (US)

(73) Assignee: Fujitsu Semiconductor Limited, Yokohama-shi (JP)

( * ) Notice: Subject to any disclaimer, the term of this patent is extended or adjusted under 35 U.S.C. 154(b) by 79 days.

(21) Appl. No.: 13/192,950

(22) Filed: Jul. 28, 2011

(65) Prior Publication Data

US 2013/0027235 A1     Jan. 31, 2013

(51) Int. Cl.
*H03M 1/10*     (2006.01)

(52) U.S. Cl.
CPC ................... *H03M 1/1004* (2013.01)
USPC ............. 341/120; 341/136; 341/144

(58) Field of Classification Search
USPC ............... 341/120, 136, 144, 153
See application file for complete search history.

(56) References Cited

U.S. PATENT DOCUMENTS

| | | | | |
|---|---|---|---|---|
| 4,393,370 | A | * | 7/1983 | Hareyama ................ 341/136 |
| 5,248,970 | A | | 9/1993 | Sooch et al. ............. 341/120 |
| 5,889,484 | A | * | 3/1999 | Noguchi .................. 341/144 |
| 5,955,980 | A | | 9/1999 | Hanna ..................... 341/120 |
| 6,166,670 | A | | 12/2000 | O'Shaughnessy ........ 341/136 |
| 6,181,194 | B1 | * | 1/2001 | Tiilikainen ............... 327/538 |
| 6,411,232 | B1 | * | 6/2002 | Miller et al. ............. 341/120 |
| 6,738,000 | B2 | | 5/2004 | Boxho .................... 341/120 |
| 7,193,545 | B2 | | 3/2007 | Morrow et al. .......... 341/143 |
| 7,205,920 | B2 | | 4/2007 | Morrow et al. .......... 341/144 |
| 2002/0014984 | A1 | * | 2/2002 | Matsusaka ............... 341/153 |

OTHER PUBLICATIONS

S. Paton, "Linearity Enhancement Techniques in Low OSR, High Clock Rate Multi-bit Continuous-Time Sigma-Delta Modulators", IEEE 2004; Custom Integrated Circuits Conference.
Fattaruso, "Self-Calibration Techniques for a Second-Order Multibit Sigma-Delta Modulator", IEEE Journal of Solid State Circuits, vol. 28, No. 12, Dec. 1993.
Y. Cong, "A 1.5V 14-bit 100-MS/s Self-Calibrated DAC". IEEE Journal of Solid State Circuits, vol. 38, No. 12, Dec. 2003.
S. Saeedi, "A 1-V 400MS/s 14bit Self-Calibrated CMOS DAC with Enhanced Dynamic Linearity", ISCAS, 2004, pp. I-349-I352, 2004.
H. Hristov, "A low-complexity calibration algorithm for current steering DACs", IEEE 27th Int'l Spring Seminar on Electronics Technology, 2004, pp. 162-166, 2004.
G. Radulov, An on-chip self-calibration method for current mismatch in D/A Convertors, IEEE Proceedings of ESSCIRC, Grenoble, France, 2005, pp. 169-172.
W. Jiang, "Build-in Self-Calibration of On-Chip DAC and ADC", IEEE International Test Conference, 2008, pp. 1-10.
Y. Chen, "Split Capacitor DAC Mismatch Calibration in Successive Approximation ADC", IEEE 2009 Custon Integrated Circuits Conference (CICC), 2009, pp. 279-282.
Rudy van de Plassche, "CMOS Integrated Analog-to-Digital and Digital-to-Analog Converters", Kluwer Academic Pulishers, Boston, MA. 2003, pp. 302-306.

* cited by examiner

*Primary Examiner* — Howard Williams
(74) *Attorney, Agent, or Firm* — Baker Botts L.L.P.

(57) ABSTRACT

A digital-to-analog converter (DAC) is disclosed. According to some embodiments of the present disclosure, a DAC may include a plurality of current-steering elements, wherein each respective current-steering element is configured to operate as instructed by a respective calibration signal during respective steps in a calibration cycle, and at least one current-steering element is configured to operate as instructed by a first control signal during at least a first step in which the at least one current-steering element is not being calibrated, and operate as instructed by a second control signal during at least a second step in which the at least one current-steering element is not being calibrated.

21 Claims, 4 Drawing Sheets

| CAL STEP | \multicolumn{17}{c}{CURRENT-STEERING ELEMENT/DATA-BIT MULTIPLEXING} |
| --- | --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 13 | 14 | 15 | 16 | 17 |
| 1 | cal | 1 | 2 | 3 | 4 | 5 | 6 | 7 | 8 | 9 | 10 | 11 | 12 | 13 | 14 | 15 | 16 |
| 2 | 1 | 2 | cal | 3 | 4 | 5 | 6 | 7 | 8 | 9 | 10 | 11 | 12 | 13 | 14 | 15 | 16 |
| 3 | 1 | 2 | 3 | 4 | cal | 5 | 6 | 7 | 8 | 9 | 10 | 11 | 12 | 13 | 14 | 15 | 16 |
| 4 | 1 | 2 | 3 | 4 | 5 | 6 | cal | 7 | 8 | 9 | 10 | 11 | 12 | 13 | 14 | 15 | 16 |
| 5 | 1 | 2 | 3 | 4 | 5 | 6 | 7 | 8 | cal | 9 | 10 | 11 | 12 | 13 | 14 | 15 | 16 |
| 6 | 1 | 2 | 3 | 4 | 5 | 6 | 7 | 8 | 9 | 10 | cal | 11 | 12 | 13 | 14 | 15 | 16 |
| 7 | 1 | 2 | 3 | 4 | 5 | 6 | 7 | 8 | 9 | 10 | 11 | 12 | cal | 13 | 14 | 15 | 16 |
| 8 | 1 | 2 | 3 | 4 | 5 | 6 | 7 | 8 | 9 | 10 | 11 | 12 | 13 | 14 | cal | 15 | 16 |
| 9 | 1 | 2 | 3 | 4 | 5 | 6 | 7 | 8 | 9 | 10 | 11 | 12 | 13 | 14 | 15 | 16 | cal |
| 10 | 1 | 2 | 3 | 4 | 5 | 6 | 7 | 8 | 9 | 10 | 11 | 12 | 13 | 14 | 15 | cal | 16 |
| 11 | 1 | 2 | 3 | 4 | 5 | 6 | 7 | 8 | 9 | 10 | 11 | 12 | 13 | cal | 14 | 15 | 16 |
| 12 | 1 | 2 | 3 | 4 | 5 | 6 | 7 | 8 | 9 | 10 | 11 | cal | 12 | 13 | 14 | 15 | 16 |
| 13 | 1 | 2 | 3 | 4 | 5 | 6 | 7 | 8 | 9 | cal | 10 | 11 | 12 | 13 | 14 | 15 | 16 |
| 14 | 1 | 2 | 3 | 4 | 5 | 6 | 7 | cal | 8 | 9 | 10 | 11 | 12 | 13 | 14 | 15 | 16 |
| 15 | 1 | 2 | 3 | 4 | 5 | cal | 6 | 7 | 8 | 9 | 10 | 11 | 12 | 13 | 14 | 15 | 16 |
| 16 | 1 | 2 | 3 | cal | 4 | 5 | 6 | 7 | 8 | 9 | 10 | 11 | 12 | 13 | 14 | 15 | 16 |
| 17 | 1 | cal | 2 | 3 | 4 | 5 | 6 | 7 | 8 | 9 | 10 | 11 | 12 | 13 | 14 | 15 | 16 |

SELF-CALIBRATED DAC WITH REDUCED GLITCH MAPPING

TECHNICAL FIELD

The present disclosure relates generally to electronic circuits and, more particularly, to self-calibrated digital-to-analog converters.

BACKGROUND

In electronics, a digital-to-analog converter (DAC) is a device that converts a digital signal into an analog signal. DACs may be widely used in numerous applications and may, for example, be implemented as high speed converters suitable for use in telecommunication systems.

Multi-bit DACs (i.e., DACs with greater than two potential output values) may include a plurality of current sources that are controlled by a digital input signal and drive a transimpedance amplifier in order to generate an analog voltage output. The accuracy of a DAC may depend on the accuracy of the individual current sources. Similarly, the linearity of a DAC may depend on how well the individual current sources match each other. To improve the accuracy and/or the linearity of a DAC, the DAC's current sources may be continuously calibrated during operation of the DAC.

SUMMARY

A digital-to-analog converter (DAC) is disclosed. According to some embodiments of the present disclosure, a DAC may include a plurality of current-steering elements, wherein each respective current-steering element is configured to operate as instructed by a respective calibration signal during respective steps in a calibration cycle, and at least one current-steering element is configured to operate as instructed by a first control signal during at least a first step in which the at least one current-steering element is not being calibrated, and operates as instructed by a second control signal during at least a second step in which the at least one current-steering element is not being calibrated.

Technical advantages of one or more embodiments of the present disclosure may include improved accuracy and reduced glitching during a calibration cycle for the current-steering elements of a DAC.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
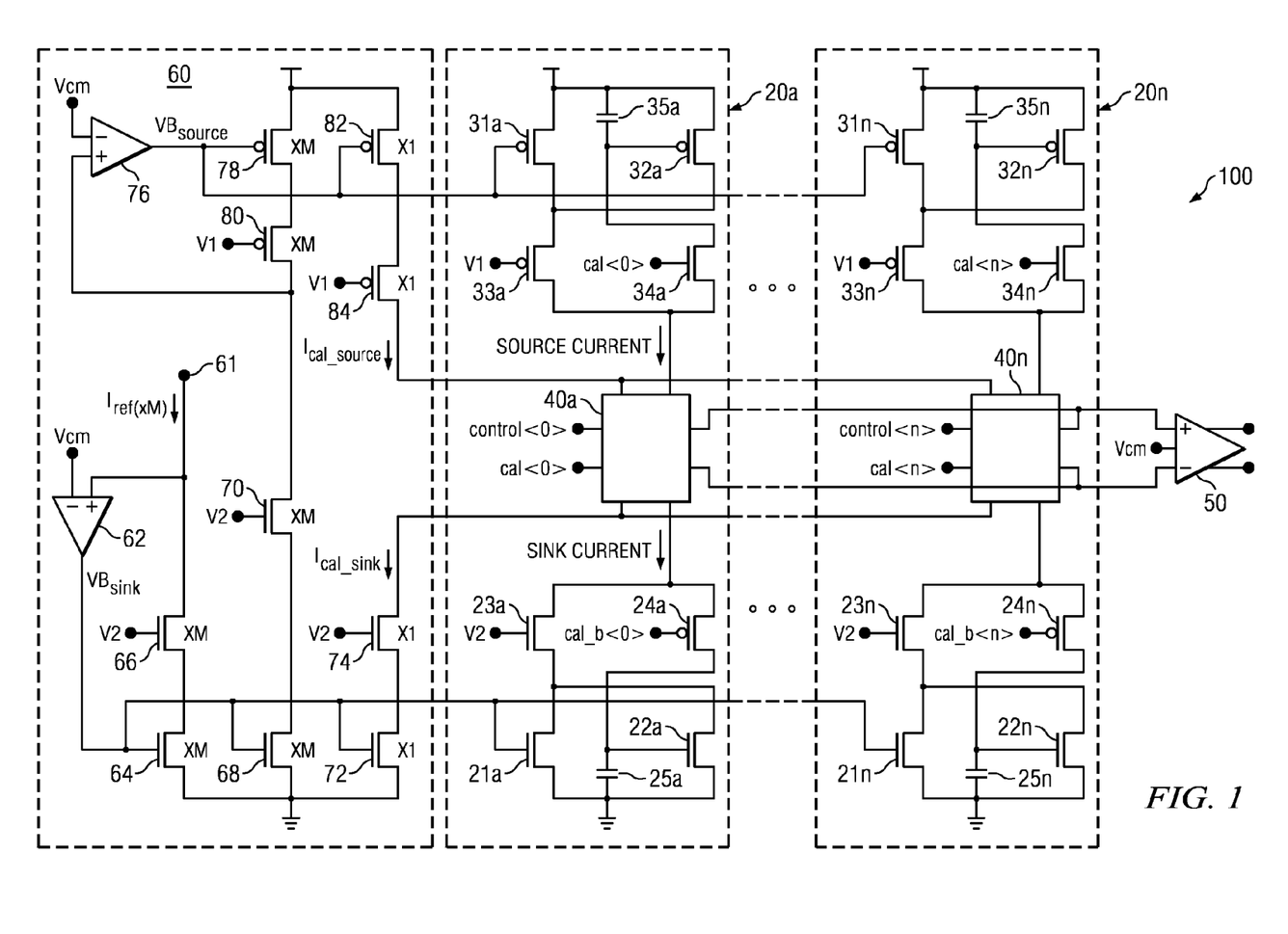
FIG. 1 illustrates a block diagram of an example digital-to-analog converter (DAC), in accordance with certain embodiments of the present disclosure.

FIG. 1 illustrates a block diagram of an example digital-to-analog converter (DAC) 100, in accordance with certain embodiments of the present disclosure. DAC 100 may include a reference generator 60, a plurality of current-steering elements 20, and an output amplifier 50. Power may be supplied to amplifier 100 through a high potential power supply and a low potential power supply. For the purposes of this disclosure, a high potential power supply may be referred to as "VDD," and a low potential power supply may be referred to as "GND."

As shown in FIG. 1, reference generator 60 may receive a reference current, $I_{ref}$. As described in greater detail below, reference generator 60 may utilize the reference current to bias devices in such a manner as to allow the reference current to be mirrored (i.e., duplicated) by other current sourcing and current sinking devices. Reference generator may also generate a calibration source current, $I_{cal\_source}$, and a calibration sink current, $I_{cal\_sink}$, from which the current sources and current sinks in current-steering elements 20a-n may be calibrated.

As shown in FIG. 1, DAC 100 may include a plurality of current-steering elements 20. Depending on the control settings for a current-steering element 20, the source and sink currents of current-steering element 20 may be steered in one of three manners. In a first setting, the source current may be steered to the positive input of amplifier 50 while the sink current is pulled from the negative input of amplifier 50. In a second setting, the source current may be steered to the negative input of amplifier 50 while the sink current is pulled from the positive input of amplifier 50. Alternatively, when a particular current-steering element 20 is undergoing calibration, the path of the source current of current-steering element 20 may be coupled to the path of the calibration sink current of reference generator 60, and the path of the sink current of current-steering element 20 may be coupled to the path of the calibration source current of reference generator 60.

As shown in FIG. 1, DAC 100 may include an "n" number of current-steering elements 20. The "n" number may be any suitable number, and may depend at least in part on the number of potential outputs for DAC 100. For example, in some embodiments, DAC 100 may comprise a self-calibrating seventeen-level DAC with seventeen potential output values. In such embodiments, sixteen matching current-steering elements 20 may combine to generate seventeen potential output values (e.g., zero to sixteen current-steering elements with a first setting as described above). Further, a seventeenth current-steering element 20 may be utilized for calibration. As described below in further detail in conjunction with FIG. 3, DAC 100 may rotate which one of the "n" number of current-steering elements 20 is being calibrated while also adjusting the control signal assignments for the current-steering elements 20 rather than having a single designated element that substitutes for each of the other respective elements as they are being calibrated one at a time.

As described above, the source and sink currents of the numerous current-steering elements 20a-n may be steered to and from the positive and negative inputs of amplifier 50. The sum of the source and sink currents on the positive input of amplifier 50 versus the sum of the source and sink currents on the negative input of amplifier 50 may form a differential current input to amplifier 50. In some embodiments, output amplifier 50 may comprise a transimpedance amplifier configured to convert the differential current into a differential voltage. In some embodiments, output amplifier may comprise a differential integrator configured to integrate the differential current signal over time. Output amplifier 50 may operate differentially with an analog ground, otherwise referred to as a common mode, tied to a common-mode voltage reference $V_{cm}$. Accordingly, the positive and negative inputs of amplifier 50 may operate at a voltage potential close to $V_{cm}$ (e.g., $V_{cm}$ plus or minus half the differential voltage input). Thus, current-steering elements 20*a-n* may source current to and sink current from nodes with voltage potentials close to $V_{cm}$. As described in further detail below, the operating conditions of the current sources and current sinks in current-steering elements 20*a-n* may be mimicked in the reference generator to provide for low offset current biasing.

As shown in FIG. 1, the reference generator 60 may receive a reference current ($I_{ref}$) at current reference input 61. Amplifier 62 may have a positive input terminal coupled to current reference input 61, a negative input terminal coupled to $V_{cm}$, and an output coupled to a gate of an n-type metal-oxide semiconductor field-effect transistor (NMOS) 64. NMOS 64 may have a source coupled to GND, and a drain coupled to the source of cascode NMOS 66, which may have a gate driven by a bias voltage V2 and a drain coupled to current reference input 61.

Amplifier 62 may be utilized in reference generator 60 in order to mirror $I_{ref}$ with a high level of accuracy. Amplifier 62 may drive the node $VB_{sink}$, which may be coupled to the gate of NMOS 64, at the precise voltage level required for NMOS 64 and cascode NMOS 66 to sink $I_{ref}$ when the voltage at the drain of cascode NMOS 66 is approximately equal to $V_{cm}$. Accordingly, NMOS 64 and cascode NMOS 66 may operate under the same conditions as matching current mirror devices in current-steering elements 20*a-n* that are sinking current from an input of amplifier 50, which may be operating with an analog ground coupled to $V_{cm}$. Thus, the reference current, $I_{ref}$, may be duplicated in current-steering elements 20*a-n* with a higher level of accuracy than if the drain of cascode NMOS 66 was not forced by a dedicated amplifier 62 to be approximately equal to $V_{cm}$.

Reference generator 60 may include NMOS 68 and cascode NMOS 70. Similar to NMOS 64, NMOS 68 may have a gate driven by $VB_{sink}$, a source tied to GND, a drain coupled to the source of a cascode NMOS 70 and may, otherwise, be configured to match NMOS 64. Similar to cascode NMOS 66, cascode NMOS 70 may have a gate driven by bias voltage V2 and a drain coupled to a node that is operating at a voltage approximately equal to $V_{cm}$. Accordingly, NMOS 68 and cascode NMOS 70 may sink a current approximately equal to $M \times I_{ref}$.

Reference generator 60 may include NMOS 72 and cascode NMOS 74. Similar to NMOS 64, NMOS 72 may have a gate driven by $VB_{sink}$, a source tied to GND, a drain coupled to the source of a cascode NMOS 74 and may, otherwise, be configured to match NMOS 64. Similar to cascode NMOS 66, cascode NMOS 74 may have a gate driven by bias voltage V2. Accordingly, NMOS 72 and cascode NMOS 74 may sink a current, $I_{cal\_sink}$, that is approximately equal to $I_{ref}$.

Reference generator 60 may include an amplifier 76 along with a p-type metal-oxide semiconductor field-effect transistor (PMOS) 78 and a cascode PMOS 80. Amplifier 76 may include a positive input terminal coupled to the drain of PMOS 80 and the drain of NMOS 70, which, as described above, may be configured to sink a current approximately equal to $M \times I_{ref}$. Amplifier 76 may include a negative input terminal coupled to $V_{cm}$, and an output coupled to a gate of PMOS 78. PMOS 78 may have a source coupled to VDD, and a drain coupled to the source of cascode PMOS 80, which may have a gate driven by a bias voltage V1, and a drain coupled to the drain of NMOS 70.

Amplifier 76 may be utilized in reference generator 60 in order to mirror a source current equivalent to $I_{ref}$ with a high level of accuracy. Amplifier 76 may drive the node $VB_{source}$, which may be coupled to the gate of PMOS 78, at the precise level required for PMOS 78 and cascode PMOS 80 to source a current equivalent to $M \times I_{ref}$ when the voltage at the drain of cascode PMOS 80 is approximately equal to $V_{cm}$. Accordingly, PMOS 78 and cascode PMOS 80 may operate under the same conditions as matching current mirror devices in current-steering elements 20*a-n* that are sourcing current to an input of amplifier 50, which may be operating with an analog ground coupled to $V_{cm}$. Thus, source currents equivalent to $I_{ref}$ may be generated in current-steering elements 20*a-n* with a higher level of accuracy than if the drain of cascode PMOS 80 was not forced by a dedicated amplifier 76 to be approximately equal to $V_{cm}$.

Reference generator 60 may include PMOS 82 and cascode PMOS 84. Similar to PMOS 78, PMOS 82 may have a gate driven by $VB_{source}$, a source tied to VDD, a drain coupled to the source of a cascode PMOS 84 and may, otherwise, be configured to match PMOS 78. Similar to cascode PMOS 80, cascode PMOS 84 may have a gate driven by bias voltage V1. Accordingly, PMOS 82 and cascode PMOS 84 may mirror PMOS 78 and cascode PMOS 80, and source a current, $I_{cal\_source}$, that is approximately equal to $I_{ref}$.

The embodiment of reference generator 60 depicted in FIG. 1 may receive a reference current, $M \times I_{ref}$, in the form of a source current. As described above, $M \times I_{ref}$ may be used to generate a bias voltage at $VB_{sink}$ for various sink currents. One of the sink currents may be used to generate a bias at $VB_{source}$ for a plurality of source currents. In some embodiments, reference generator 60 may receive a reference current in the form of a sink current. Accordingly, in some embodiments, a reference current may be used to generate a bias for various source currents, and one of the source currents may be used to generate a bias for a plurality of sink currents.

The use of amplifier 62 to generate sink currents in current-steering elements 20*a-n* that closely match $M \times I_{ref}$, and the use of amplifier 76 to generate source currents in current-steering elements 20*a-n* that closely match $I_{ref}$, not only ensure that source currents match other source currents and that sink currents match other sink currents, but also ensures that the source currents in the plurality of current-steering elements 20 match the sink currents in the plurality of current-steering elements 20. The enhanced matching of the respective source currents and the respective sink currents in current-steering elements 20 may enhance the linearity of DAC 100.

In order to trade-off noise requirements and current consumption, reference generator 60 may be selectively configured to receive a range of different current references at current reference input 61. A current reference received at current reference input 61 may include a noise component. This noise component is typically thermal and flicker (1/f) noise contributions of the current reference circuit generating M×Iref. This may also include noise from voltage regulators, references, and a multitude of other sources related to the generation of the current reference received at current reference input 61. The major noise contribution of M×Iref may be unchanged relative to the value of M since the number of parallel devices used to generate the higher values of M×Iref is also larger and maintains a relatively fixed noise level. Thus, inside reference generator 60, the relatively fixed noise contribution may be scaled down by the ratio 1/M, at the expense of higher current and device area. The level of noise from the reference current that reaches the output of the DAC may depend on whether and, to what extent, the reference current is scaled down for use in the current-steering elements 20a-n.

The current-steering elements 20a-n in DAC 100 may be configured to sink and source currents equivalent to $I_{ref}$. If, for example, a nominal reference current, $M \times I_{ref}$, is received at current reference input 61, then it may be unnecessary to scale the reference current down for use in current-steering elements 20a-n. Accordingly, NMOS 64, NMOS 68, cascode NMOS 66, and cascode NMOS 70, as well as PMOS 78 and cascode PMOS 80, may be selectively configured to be sized at nominal 1× sizes. Accordingly, reference generator 60 may consume only a nominal amount of current. However, similar to the way $I_{ref}$ is mirrored at a 1:1 ratio for use in the current-steering elements 20a-n, the noise component of $I_{ref}$ may also be mirrored at a ratio of 1:1. Thus, the noise component of $I_{ref}$ may not be scaled down before reaching the output of DAC 100.

Alternatively, reference generator 60 may receive a higher reference current (e.g., four times $I_{ref}$) which may be scaled down for use in current-steering elements 20a-n. Accordingly, the noise component of the higher reference current may also be scaled down causing lower noise at the output of DAC 100. If, for example, a higher reference current at a level of four times $I_{ref}$ is received at current reference input 61, then the higher reference current may be scaled down at a ratio of 4:1 for use in current-steering elements 20a-n. NMOS 64, NMOS 68, cascode NMOS 66, and cascode NMOS 70, as well as PMOS 78 and cascode PMOS 80, may be selectively configured to be sized at 4× sizes. Similar to the way the higher reference current is mirrored at a ratio of 4:1 for use in the current-steering elements 20a-n, the noise component of the higher reference current may also be mirrored at a ratio of 4:1. Accordingly, the noise component of the higher reference current may be scaled down before reaching the output of DAC 100 at the expense of higher current consumption inside reference generator 60.

DAC 100 may be configured to operate in either a low current mode or a low noise mode depending on the requirements of the signal that is being converted. For example, if a system that is using DAC 100 to convert a signal requires that the signal have a lower noise component, the system may feed a higher reference current to DAC 100 and instruct DAC 100 to utilize the larger sized devices for NMOS 64, NMOS 68, cascode NMOS 66, and cascode NMOS 70, as well as PMOS 78 and cascode PMOS 80. Alternatively, if a signal being converted by DAC has a less stringent noise requirement, the system may feed a nominal reference current to DAC 100 and instruct DAC 100 to utilize nominally sized devices for NMOS 64, NMOS 68, cascode NMOS 66, and cascode NMOS 70, as well as PMOS 78 and cascode PMOS 80. The device sizes for NMOS 64, cascode NMOS 66, NMOS 68, and cascode NMOS 70, as well as PMOS 78 and cascode PMOS 80, may be varied relative to their counterparts in current-steering elements 20a-n by switching in and out parallel individual devices to maintain a current mirror ratio such that the current-steering elements 20a-n reproduce Iref.

As shown in FIG. 1, DAC 100 may include a plurality of current-steering elements 20. For example, a self-calibrating DAC with seventeen potential output values may include seventeen current-steering elements 20. One current-steering element 20 may be calibrated at a time, while the other sixteen matching current-steering elements 20 may combine to generate one of seventeen values (e.g., zero to sixteen current-steering elements with a first setting as described above). As described below in further detail in conjunction with FIG. 3, DAC 100 may rotate which current-steering element 20 is the calibration element rather than having a single current-steering element 20 designated as the calibration element.

Current-steering element 20 may include a PMOS 31, a PMOS 32, a cascode PMOS 33, an NMOS 34, and a capacitor 35. PMOS 31 may have a gate driven by $VB_{source}$, a source coupled to VDD, and a drain coupled to the source of cascode PMOS 33. Cascode PMOS 33 may have a gate driven by bias voltage V1 and drain coupled to current switch 40, which may selectively steer the source current of current-steering element 20 to either the positive input of amplifier 50, the negative input of amplifier 50, or to the path of $I_{cal\_sink}$. PMOS 32 may have a source coupled to VDD and a drain coupled to the source of cascode PMOS 33. Capacitor 35 may have a first terminal coupled to VDD and a second terminal coupled the gate of PMOS 32. NMOS 34 may have a drain coupled to the gate of PMOS 32 and a source coupled to the drain of cascode PMOS 33.

PMOS 31 and PMOS 32 may be sized such that, in combination, they provide a source current approximately equivalent to $I_{ref}$. But due to imperfections caused by, for example, semiconductor processing mismatch, PMOS 31 and PMOS 32 may not perfectly match PMOS 78. In order to compensate for that mismatch, the current sourced by PMOS 32 may be calibrated such that the total current sourced by PMOS 31 and PMOS 32 may be equivalent to $I_{ref}$. The required size of PMOS 32 as compared to the total size of PMOS 31 and PMOS 32, in combination, may depend on the mismatch parameters for the PMOS 78, PMOS 31, and PMOS 32 in the particular semiconductor process in which DAC 100 is manufactured.

During calibration of current-steering element 20, current switch 40 may couple the path of the source current of current-steering element 20 to the path of the calibration sink current, $I_{cal\_sink}$. Also, NMOS 34 may be turned on, thus, shorting the gate of PMOS 32 to the drain of cascode PMOS 33. During calibration, reference generator 60 may provide a calibration sink current, $I_{cal\_sink}$, that is equivalent to $I_{ref}$ and PMOS 31 may continue to mirror the source current in reference generator 60. With a gate of PMOS 32 shorted to the drain of cascode PMOS 33, PMOS 32 may operate in a diode-connected manner. The gate of PMOS 32 may be pulled down to the precise voltage level such that PMOS 32 sources the difference between $I_{cal\_sink}$ and the current sourced by PMOS 31. At the same time, capacitor 35 may be charged to the gate-to-source voltage ($V_{gs}$) of PMOS 32. After calibration of current-steering element 20, NMOS 34 may be turned off and current switch 40 may redirect the source current of current-steering element 20 to either the positive or negative input of amplifier 50. After calibration, the stored voltage potential across capacitor 35 will continue to drive PMOS 32, such that the combined source current of PMOS 31 and PMOS 32 is equivalent to $I_{cal\_sink}$, which is approximately equivalent to $I_{ref}$.

Current-steering element 20 may include an NMOS 21, an NMOS 22, a cascode NMOS 23, a PMOS 24, and a capacitor 25. NMOS 21 may have a gate driven by $VB_{sink}$, a source coupled to GND, and a drain coupled to the source of cascode NMOS 23. Cascode NMOS 23 may have a gate driven by bias voltage V2 and drain coupled to current switch 40, which may selectively steer the sink current of current-steering element 20 to either the positive input of amplifier 50, the negative input of amplifier 50, or to the path of $I_{cal\_source}$. NMOS 22 may have a source coupled to GND and a drain coupled to the source of cascode NMOS 23. Capacitor 25 may have a first terminal coupled to GND and a second terminal coupled the gate of NMOS 22. PMOS 24 may have a drain coupled to the gate of NMOS 22 and a source coupled to the drain of NMOS 23.

NMOS 21 and NMOS 22 may be sized such that, in combination, they provide a source current approximately equivalent to $I_{ref}$. But due to imperfections caused by, for example, semiconductor processing mismatch, NMOS 21 and NMOS 22 may not perfectly match NMOS 64. In order to compensate for that mismatch, the current sourced by NMOS 22 may be calibrated such that the total current sourced by NMOS 21 and NMOS 22 may be equivalent to $I_{ref}$. The required size of NMOS 22 as compared to the total size of NMOS 21 and NMOS 22, in combination, may depend on the mismatch parameters for the NMOS 64, NMOS 21, and NMOS 22 in the particular semiconductor process in which DAC 100 is manufactured.

The sink current of current-steering element 20 may be calibrated at the same time and in the same manner as the source current of current-steering element 20. During calibration of current-steering element 20, current switch 40 may couple the path of the sink current of current-steering element 20 to the path of the calibration source current, $I_{cal\_source}$. Also, PMOS 24 may be turned on, thus, shorting the gate of NMOS 22 to the drain of cascode NMOS 23. During calibration, reference generator 60 may provide a calibration source current, $I_{cal\_source}$, that is equivalent to $I_{ref}$, and NMOS 21 may continue to mirror the sink current in reference generator 60. With a gate of NMOS 22 shorted to the drain of cascode NMOS 23, NMOS 22 may operate in a diode-connected manner. The gate of NMOS 22 may be pulled up to the precise voltage level such that NMOS 22 sinks the difference between $I_{cal\_source}$ and the current sunk by NMOS 21. At the same time, capacitor 25 may be charged to the gate-to-source voltage ($V_{gs}$) of NMOS 22. After calibration of current-steering element 20, PMOS 24 may be turned off and current switch 40 may redirect the sink current of current-steering element 20 to either the positive or negative input of amplifier 50. After calibration, the stored voltage potential across capacitor 25 will continue to drive NMOS 22, such that the combined sink current of NMOS 21 and NMOS 22 is equivalent to $I_{cal\_source}$, which is approximately equivalent to $I_{ref}$.

Figure 2:
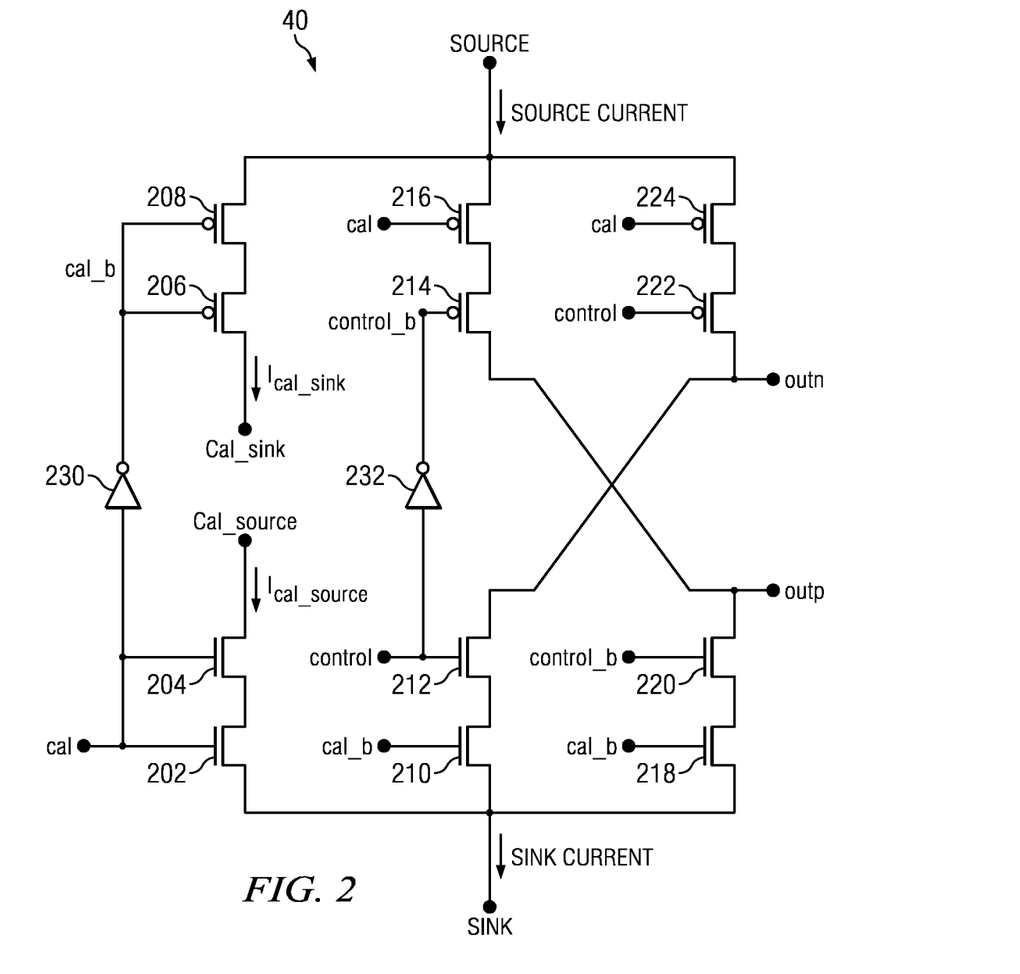
FIG. 2 illustrates a schematic diagram of an example current switch, in accordance with certain embodiments of the present disclosure.

FIG. 2 illustrates a schematic diagram of an example current switch 40, in accordance with certain embodiments of the present disclosure. Current switch 40 may include a source current input ("source") and a sink current input ("sink"). Current switch 40 may include a calibration control signal input ("cal") which may instruct the direction of the source current and the sink current during calibration of the current-steering element 20. Current switch 40 may include a control signal input ("control") which may instruct direction of the source and sink currents when current-steering element 20 is an active element, i.e., not being calibrated.

As shown in FIG. 2, current switch 40 may include an NMOS 202, an NMOS 204, a PMOS 206, a PMOS 208, and an inverter 230. Inverter 230 may have an input coupled to the cal input and an output coupled to a node labeled cal_b. NMOS 202 may have a source coupled to the path of the sink current in current-steering element 20, a gate coupled to cal input, and a drain coupled to the source of NMOS 204. NMOS 204 may have a gate coupled to the cal input and a drain coupled to the path of the calibration source current, $I_{cal\_source}$. PMOS 208 may have a source coupled to the path of the source current in current-steering element 20, a gate coupled to the cal_b node, and a drain coupled to the source of PMOS 206. PMOS 206 may have a gate coupled to the cal_b node and a drain coupled to the path of the calibration sink current, $I_{cal\_sink}$.

As described above, current-steering element 20 may be configured to be calibrated. The cal input may be coupled to the gates of NMOS 202 and NMOS 204, as well as the input of inverter 230, which may have an output coupled at a cal_b node to the respective gates of PMOS 206 and PMOS 208. During calibration, the cal signal may be high (e.g., logic 1) and the signal at cal_b may be low (e.g., logic 0). Accordingly, during calibration, NMOS 202 and NMOS 204 may be driven on. Thus, the path of source current in current-steering element 20 may be coupled to the path of the calibration sink current ($I_{cal\_sink}$) allowing the source current to be calibrated based on $I_{cal\_sink}$. Similarly, during calibration, PMOS 206 and PMOS 208 may be driven on. Thus, the path of the sink current in current-steering element 20 may be coupled to the path of the calibration source current ($I_{cal\_source}$) allowing the sink current to be calibrated based on $I_{cal\_source}$.

As shown in FIG. 2, current switch 40 may include an NMOS 210, an NMOS 212, an NMOS 218, an NMOS 220, and an inverter 232. Inverter 232 may have an input coupled to the control input for current-steering element 20 and an output coupled to a node labeled control_b. NMOS 210 may have source coupled to the path of the sink current in current-steering element 20, a gate coupled to cal_b, and a drain coupled to the source of NMOS 212. NMOS 212 may have a gate coupled to the control input and a drain coupled to the outn output. NMOS 218 may have source coupled to the path of the sink current in current-steering element 20, a gate coupled to cal_b, and a drain coupled to the source of NMOS 220. NMOS 220 may have a gate coupled to the control_b node and a drain coupled to the outp output.

As shown in FIG. 2, current switch 40 may include a PMOS 216, a PMOS 214, a PMOS 224, and a PMOS 222. PMOS 216 may have a source coupled to the path of the source current in current-steering element 20, a gate coupled to the cal input, and a drain coupled to PMOS 214. PMOS 214 may have a gate coupled to the control_b node and a source coupled to the outp output. PMOS 224 may have a source coupled to the path of the source current in current-steering element 20, a gate coupled to the cal input, and a drain coupled to PMOS 222. PMOS 222 may have a gate coupled to the control input and a source coupled to the outn output.

During calibration, the signal at the cal input may be high (e.g., logic 1) and the signal at the cal_b node may be low (e.g., logic 0). Accordingly, NMOS 210, NMOS 218, as well as PMOS 216 and PMOS 224, may be driven off. Thus, during calibration, the source current and the sink current in current-steering element 20 may be blocked from the outn and outp outputs of current switch 40. However, when current-steering element 20 is an active current-steering element 20 in DAC 100 (i.e., not in calibration), the signal at the cal input may be low (e.g., logic 0) and the signal at the cal_b node may be high (e.g., logic 1). Accordingly, when not in calibration, NMOS 210, NMOS 218, PMOS 216, and PMOS 224 may be driven on, and the source current and the sink current may be respectively steered to the outn or outp nodes according to the control input of current switch 40.

When the signal at the control input is high (e.g., logic 1), the signal at the control_b node may be low (e.g., logic 0), and NMOS 212 and PMOS 214 may be driven on. Accordingly, when not in calibration, and when the control input is high, the source current may be steered to the outp output and the sink current may be steered from the outn output. Alternatively, when the signal at the control input is low (e.g., logic 0), the signal at the control_b node may be high (e.g., logic 1), and NMOS 220 and PMOS 222 may be driven on. Accordingly, when not in calibration, and when the control input is low, the source current may be steered to the outn output and the sink current may be steered from the outp output.

As described above, the source current and sink current may always have one available path out of three potential paths. Accordingly, the source current and the sink current may continuously flow as the cal and control signals are switched. This continuous operation of the source current and the sink current allow the current sourcing devices in current-steering element 20 and the current sinking devices in current-steering element 20 to be continuously biased, which in turn allows DAC 100 to operate at a high frequency, i.e., with a high sampling rate.

In traditional architectures for a self-calibrated seventeen-level DAC, a DAC may have sixteen current-steering elements, each of which is controlled by a specific one of sixteen data bits. Each data bit may control whether its current-steering element operates in a first setting (e.g., steering the source current to the positive input of an amplifier and steering sink current from the negative input of an amplifier) or a second setting (e.g., steering the source current to the negative input of an amplifier and steering the sink current from the positive input of an amplifier). Additionally, in traditional architectures for a self-calibrated seventeen-level DAC, an additional current-steering element may be designated as a calibration substitute element. During a sequence of calibration steps wherein each of the sixteen current-steering elements are calibrated one at a time, the calibration substitute element may substitute for whichever one of the sixteen current-steering elements is being calibrated at a specific time. This traditional technique allows for the continuous calibration of the sixteen current-steering elements, but has timing limitations. For example, in order for the substitute element to be capable of substituting for each of the sixteen current-steering elements, the substitute element must be controlled by the proper one out of the sixteen data bits that respectively control the sixteen current-steering elements. Such operation requires a 16:1 multiplex. The delay of such a complicated 16:1 multiplex may limit the frequency at which calibration cycle may operate. Further, the delay of a 16:1 multiplex may be limiting factor in the data rate of the DAC because the complicated multiplex will require additional logic gate delays in implementation and longer settling time between data samples.

Figure 3:
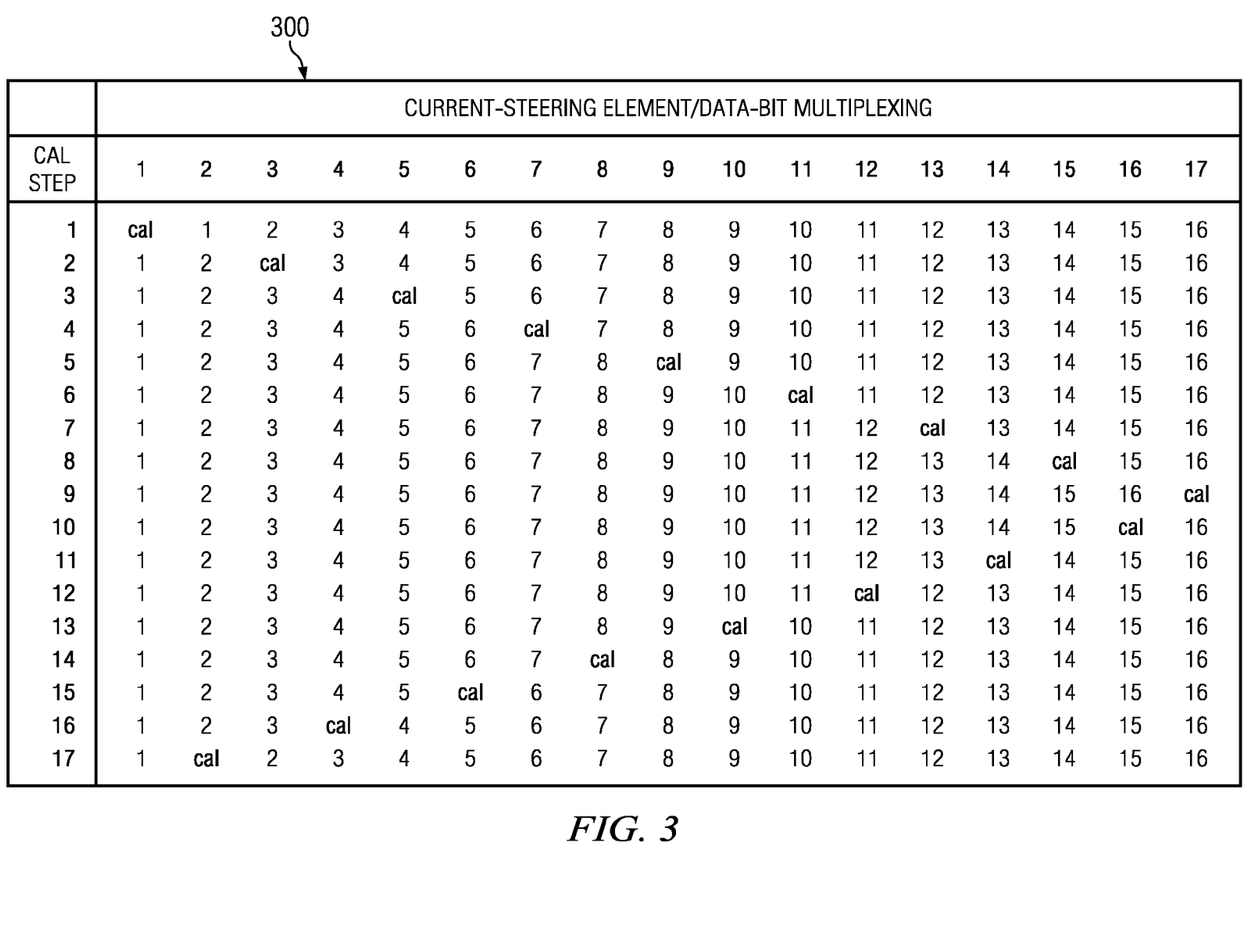
FIG. 3 illustrates a table depicting a method for continuously calibrating a multi-bit DAC, in accordance with certain embodiments of the present disclosure.

FIG. 3 illustrates a table 300 depicting a method for continuously calibrating a multi-bit DAC 100, in accordance with certain embodiments of the present disclosure. As discussed above, in an example embodiment, DAC 100 may comprise a self-calibrated seventeen-level DAC with seventeen current-steering elements 20. At any one time, sixteen of the seventeen current-steering elements 20 may be utilized to generate the DAC output signal, while one of the seventeen current-steering elements 20 may be undergoing calibration. Rather than having a single current-steering element 20 designated as a substitute element for calibration, DAC 100 may rotate which current-steering element 20 is being calibrated while adjusting the assignments for which data bits control which current-steering elements. Accordingly, during a calibration sequence as shown in table 300, any one current-steering element 20 may have more than one potential assignment with respect to which of the sixteen different data bits they are respectively controlled by. At any given time during the calibration sequence, a single current-steering element may either be in calibration, or controlled by one of up to two potential data bits.

As shown in table 300, for an embodiment of DAC 100, including seventeen current-steering elements, each of the seventeen respective current-steering elements 20 may be calibrated in a sequence of seventeen respective steps:

At step 1, a first current-steering element 20 may be designated for calibration, while a second current-steering element 20 through a seventeenth current-steering element 20 may be respectively controlled by a first data bit through a sixteenth data bit respectively.

At step 2, a third current-steering element 20 may be designated for calibration, while a first current-steering element 20 through a second current-steering element 20 may be respectively controlled by a first data bit through a second data bit, respectively, and a fourth current-steering element 20 through a seventeenth current-steering element 20 may be respectively controlled by a third data bit through a sixteenth data bit, respectively.

At step 3, a fifth current-steering element 20 may be designated for calibration, while a first current-steering element 20 through a fourth current-steering element 20 may be respectively controlled by a first data bit through a fourth data bit respectively, and a sixth current-steering element 20 through a seventeenth current-steering element 20 may be respectively controlled by a fifth data bit through a sixteenth data bit, respectively.

At step 4, a seventh current-steering element 20 may be designated for calibration, while a first current-steering element 20 through a sixth current-steering element 20 may be respectively controlled by a first data bit through a sixth data bit respectively, and an eighth current-steering element 20 through a seventeenth current-steering element 20 may be respectively controlled by a seventh data bit through a sixteenth data bit, respectively.

At step 5, a ninth current-steering element 20 may be designated for calibration, while a first current-steering element 20 through an eighth current-steering element 20 may be respectively controlled by a first data bit through an eighth data bit respectively, and a tenth current-steering element 20 through a seventeenth current-steering element 20 may be respectively controlled by a ninth data bit through a sixteenth data bit, respectively.

At step 6, an eleventh current-steering element 20 may be designated for calibration, while a first current-steering element 20 through a tenth current-steering element 20 may be respectively controlled by a first data bit through a tenth data bit respectively, and a twelfth current-steering element 20 through a seventeenth current-steering element 20 may be respectively controlled by an eleventh data bit through a sixteenth data bit, respectively.

At step 7, a thirteenth current-steering element 20 may be designated for calibration, while a first current-steering element 20 through a twelfth current-steering element 20 may be respectively controlled by a first data bit through a twelfth data bit respectively, and a fourteenth current-steering element 20 through a seventeenth current-steering element 20 may be respectively controlled by a thirteenth data bit through a sixteenth data bit, respectively.

At step 8, a fifteenth current-steering element 20 may be designated for calibration, while a first current-steering element 20 through a fourteenth current-steering element 20 may be respectively controlled by a first data bit through a fourteenth data bit respectively, and a sixteenth current-steering element 20 through a seventeenth current-steering element 20 may be respectively controlled by an fifteenth data bit through a sixteenth data bit, respectively.

At step 9, a seventeenth current-steering element 20 may be designated for calibration, while a first current-steering element 20 through a sixteenth current-steering element 20 may be respectively controlled by a first data bit through a sixteenth data bit, respectively.

At step 10, a sixteenth current-steering element 20 may be designated for calibration, while a first current-steering element 20 through a fifteenth current-steering element 20 may be respectively controlled by a first data bit through a fifteenth data bit respectively, and a seventeenth current-steering element 20 may be respectively controlled by a sixteenth data bit, respectively.

At step 11, a fourteenth current-steering element 20 may be designated for calibration, while a first current-steering element 20 through a thirteenth current-steering element 20 may be respectively controlled by a first data bit through a thirteenth data bit respectively, and a fifteenth current-steering element 20 through a seventeenth current-steering element 20 may be respectively controlled by an fourteenth data bit through a sixteenth data bit, respectively.

At step 12, a twelfth current-steering element 20 may be designated for calibration, while a first current-steering element 20 through an eleventh current-steering element 20 may be respectively controlled by a first data bit through an eleventh data bit respectively, and a thirteenth current-steering element 20 through a seventeenth current-steering element 20 may be respectively controlled by a twelfth data bit through a sixteenth data bit, respectively.

At step 13, a tenth current-steering element 20 may be designated for calibration, while a first current-steering element 20 through a ninth current-steering element 20 may be respectively controlled by a first data bit through a ninth data bit respectively, and an eleventh current-steering element 20 through a seventeenth current-steering element 20 may be respectively controlled by a tenth data bit through a sixteenth data bit, respectively.

At step 14, an eighth current-steering element 20 may be designated for calibration, while a first current-steering element 20 through a seventh current-steering element 20 may be respectively controlled by a first data bit through a seventh data bit respectively, and a ninth current-steering element 20 through a seventeenth current-steering element 20 may be respectively controlled by an eighth data bit through a sixteenth data bit, respectively.

At step 15, a sixth current-steering element 20 may be designated for calibration, while a first current-steering element 20 through a fifth current-steering element 20 may be respectively controlled by a first data bit through a fifth data bit respectively, and a seventh current-steering element 20 through a seventeenth current-steering element 20 may be respectively controlled by a sixth data bit through a sixteenth data bit, respectively.

At step 16, a fourth current-steering element 20 may be designated for calibration, while a first current-steering element 20 through a third current-steering element 20 may be respectively controlled by a first data bit through a third data bit respectively, and a fifth current-steering element 20 through a seventeenth current-steering element 20 may be respectively controlled by a fourth data bit through a sixteenth data bit, respectively.

At step 17, a second current-steering element 20 may be designated for calibration, while a first current-steering element 20 may be respectively controlled by a first data bit, and a third current-steering element 20 through a seventeenth current-steering element 20 may be respectively controlled by a second data bit through a sixteenth data bit, respectively.

After step 17, the calibration sequence may start over again at step 1.

The rotating nature of both the calibration assignment and the data bit assignments illustrated in FIG. 3 for the current-steering elements 20 in DAC 100 prevents a data delay present in traditional architectures. As described above, when one current-steering element is designated as a substitute element for each of sixteen current-steering elements, a 16:1 multiplex must be used to drive the substitute element with the proper data bit and analog current steering at the respective steps of the calibration cycle. However, as described above, no single current-steering element 20 in DAC 100 is designated as a substitute element for calibration. Rather, each current-steering element may operate as instructed by one of three control signals (i.e., by one of two potential data-bit controls or by a calibration signal). As described in conjunction with FIG. 2, a calibration signal for each respective current-steering element 20 may directly control the current paths determined in the current switch 40 of each current-steering element 20. However, if a current-steering element 20 is not being calibrated, the operation of the current switch 40 may be controlled by a control input. Accordingly, for each current-steering element 20 with two potential data-bit assignments, a 2-to-1 multiplex is required to control the respective current-steering elements with the proper data-bit. A 2-to-1 multiplex associated with DAC 100 may be switched faster than a 16-to-1 multiplex in traditional architectures and, thus, the data delay associated with traditional architectures may be avoided.

During transitions between consecutive steps in the calibration cycle, the current-steering elements 20 may experience a switchover of signals that instruct the operation of the respective current-steering elements. For example, during the transition from step 1 to step 2 in table 300, the three current-steering elements may experience a switchover of signals that instruct the operation of the respective three current-steering elements 20. During the transition from step 1 to step 2, a first current-steering element 20 may change from being instructed by a calibration signal to being instructed by a first data bit, a second current steering element 20 may change from being instructed by a first data bit to being instructed by a second data bit, and a third current-steering element 20 may change from being instructed by a second data bit to being instructed by a calibration signal.

The transition between consecutive steps in table 300 may also be described in respect to where the data bits signals are directed. For example, during the transition from step 1 to step 2 in table 300, two data bits may be redirected to different respective current-steering elements. During the transition from step 1 to step 2, a first data bit may be redirected from controlling a second current-steering element to controlling a first current-steering element, and a second data bit may be redirected from controlling a third current-steering element 20 to controlling a second current-steering element 20.

The calibration scheme, as illustrated by table 300 in FIG. 3 may reduce the maximum glitch noise that may occur when a current-steering element 20 is switched over from being controlled by one data bit to another data bit.

If the consecutive current-steering elements were calibrated in consecutive calibration steps (e.g., a first current-steering element at a first step, a second current-steering element at a second step, etc.), then each current-steering element in a DAC would require a switchover of that data bit controlling the DAC at the end of a calibration sequence. For example, in a 17-level DAC, a seventeenth current-steering element may be calibrated while a first current-steering element through a sixteenth current-steering element were controlled by a first data bit through a sixteenth data bit, respectively. Then, when starting the calibration sequence over, a first current-steering element may be calibrated while a second current-steering element through a seventeenth current-steering element were controlled by a first data bit through a sixteenth data bit, respectively. Accordingly, each of the sixteen data bits would be switched over when the repeating calibration sequence starts over at the first step, and the DAC would experience a large periodic glitch at the beginning of each repeated calibration sequence.

However, the calibration scheme, as illustrated in FIG. 3, distributes the glitch energy over time and prevents a large periodic glitch. As shown in table 300, one embodiment of DAC 100 may calibrate every other current-steering element 20 from a first current-steering element 20 to a seventeenth current-steering element 20 during successive steps 1 through 9, and then calibrate every other current-steering element 20 counting down from a sixteenth current-steering element 20 to a second current-steering element 20 during successive steps 10 through 17. Accordingly, while up to two data bits may be switched over to control different current-steering elements 20 during each calibration step, one data bit may be switched over when the repeating calibration sequence starts over at step 1. Thus, the glitch energy associated with the switchover of data bits controlling current-steering elements 20 may be spread throughout the calibration sequence and a large periodic glitch at the beginning of repeated calibration sequences may be avoided.

Figure 4:
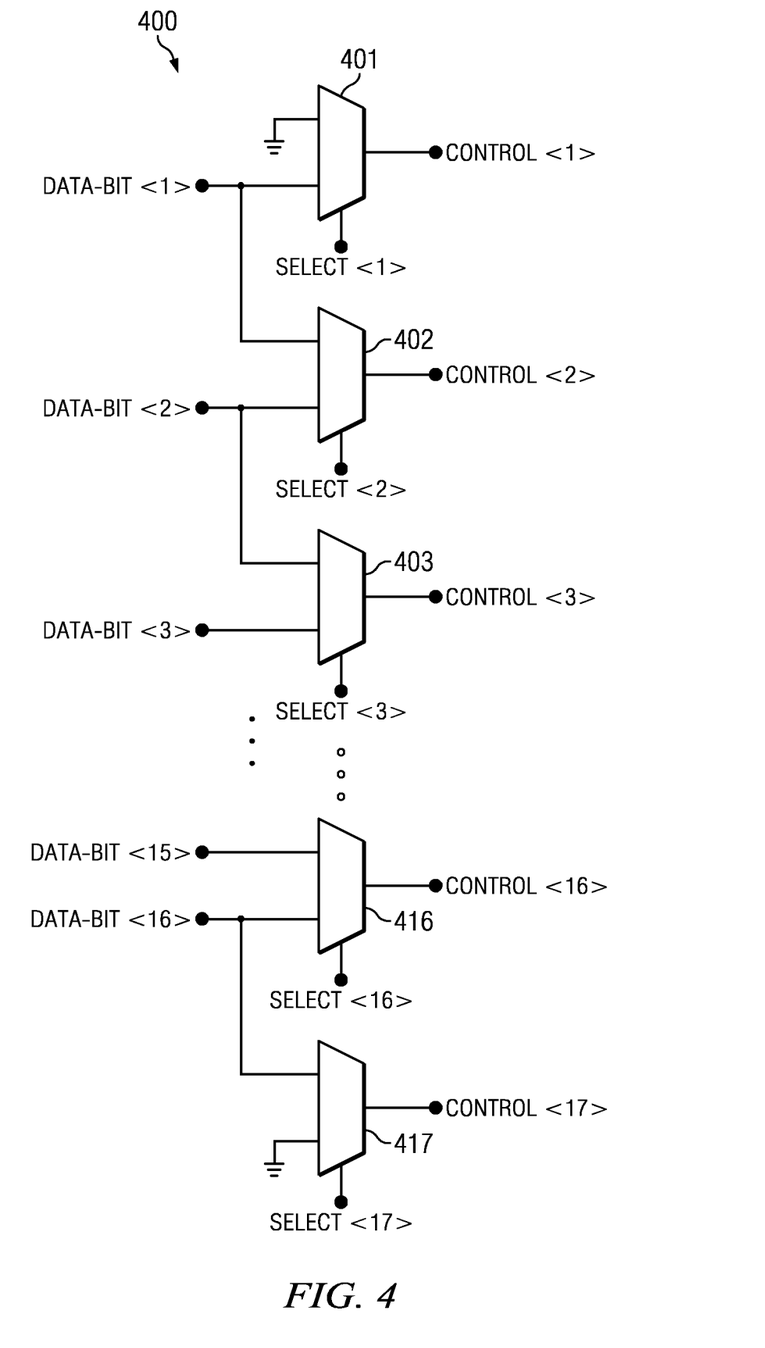
FIG. 4 illustrates a block diagram of example control circuitry for a DAC, in accordance with certain embodiments of the present disclosure.

FIG. 4 illustrates a block diagram of example control circuitry 400 associated with an example DAC 100, in accordance with certain embodiments of the present disclosure. For an example embodiment of DAC 100 including seventeen current-steering elements, control circuitry 400 may include seventeen 2-to-1 multiplexers (MUXs) 401-417. Control circuitry 400 may receive sixteen data bits (e.g., data-bit<1:16>), and convert those data bits to control signals (e.g., control<1:17>) for each of the seventeen current-steering elements 20 depending on the step in the calibration cycle DAC 100.

A 2-to-1 MUX may have a first signal input, a second signal input, a select input, and an output. The state of the select input on a 2-to-1 MUX may determine whether the MUX passes the first signal input to the output or passes the second signal input to the output. For example, if the select input is forced low (e.g., logic 0), then a 2-to-1 MUX may pass the signal at the first signal input to the output, and if the select input is forced high (e.g., logic 1), then a 2-to-1 MUX may pass the signal at the second signal input to the output.

As shown in table 300 of FIG. 3, a first current-steering element 20 may either be in calibration or controlled by a first data bit during each step of the calibration sequence. Accordingly, as shown in FIG. 4, MUX 401 may be configured to pass the data-bit<1> signal to the control<1> output. Because the first current-steering element 20 may always be in either calibration or driven by data bit 1, the select<1> signal may instruct MUX 401 to pass the data-bit<1> signal to the control<1> output during each of the calibration steps 1 through 17.

As shown in table 300 of FIG. 3, a second current-steering element 20 may either be in calibration, controlled by a first data bit, or controlled by a second data bit. Accordingly, as shown in FIG. 4, MUX 402 may be configured to pass the data-bit<1> signal or the data-bit<2> signal to the control<2> output. The select<2> signal may instruct MUX 402 to pass data-bit<1> to control<2> during calibration step 1, and may instruct MUX 402 to pass data-bit<2> to control<2> during calibration steps 2-17.

As shown in FIG. 3, a third current-steering element 20 may either be in calibration, controlled by a second data bit, or controlled by a third data bit. Accordingly, as shown in FIG. 4, MUX 403 may be configured to pass the data-bit<2> signal or the data-bit<3> signal to the control<3> output. The select<3> signal may instruct MUX 403 to pass data-bit<2> to control<3> during calibration steps 1 and 17, and may instruct MUX 403 to pass data-bit<3> to control<3> during calibration steps 2-16.

Though not displayed in FIG. 4, control circuitry 400 may include 2-to-1 MUXs 404-415 that are configured to pass data-bit<3> through data-bit<15> in the same manner as described for MUXs 402 and 403, consistent with the calibration and data bit switching scheme illustrated in FIG. 3.

As shown in FIG. 3, a sixteenth current-steering element 20 may either be in calibration, controlled by a fifteenth data bit, or controlled by a sixteenth data bit. Accordingly, as shown in FIG. 4, MUX 416 may be configured to pass the data-bit<15> signal or the data-bit<16> signal to the control<16> output. The select<16> signal may instruct MUX 416 to pass data-bit<15> to control<16> during calibration steps 1-8 and 11-17, and may instruct MUX 403 to pass data-bit<16> to control<16> during calibration steps 9 and 10.

As shown in table 300 of FIG. 3, a seventeenth current-steering element 20 may either be in calibration or controlled by a sixteenth data bit during each step of the calibration sequence. Accordingly, as shown in FIG. 4, MUX 417 may be configured to pass the data-bit<16> signal to the control<17> output. Because the seventeenth current-steering element 20 may always be in either calibration or driven by data-bit<16>, the select<17> signal may instruct MUX 417 to pass the data-bit<16> signal to the control<17> output during each of the calibration steps 1 through 17.

Although the present disclosure has been described with several embodiments, including a self-calibrated seventeen-level DAC with seventeen current-steering elements 20, other embodiments may include any suitable number of current-steering elements. As well, although the present disclosure has been described with several embodiments including a plurality of matching and equally weighted current-steering elements, other embodiments may include a plurality of binary weighted current-steering elements. Some embodiments may comprise an oversampling DAC, for example, a sigma-delta DAC. Some embodiments may comprise a Nyquist DAC.

Although the present disclosure has been described with several embodiments, various changes and modifications may be suggested to one skilled in the art. It is intended that the present disclosure encompass such changes and modifications as fall within the scope of the appended claims.

What is claimed is:

1. A digital-to-analog converter (DAC), comprising:
   a plurality of current-steering elements, wherein:
      each current-steering element comprises a current source, a current sink, and a current switch, the current switch configured to couple the current source to a calibration-current sink and couple the current sink to a calibration-current source when the current steering element is being calibrated;
      each respective current-steering element is configured to operate as instructed by a respective calibration signal during respective steps in a calibration cycle; and
      at least one current-steering element is configured to:
         operate as instructed by a first control signal during at least a first step in which the at least one current-steering element is not being calibrated; and
         operate as instructed by a second control signal during at least a second step in which the at least one current-steering element is not being calibrated.

2. The DAC of claim 1, wherein at least three respective current-steering elements experience a switchover of signals that instruct the operation of the respective current-steering elements during at least one transition between consecutive steps in the calibration cycle.

3. The DAC of claim 2, wherein no more than three respective current-steering elements experience a switchover of signals that instruct the operation of the respective current-steering elements during transitions between consecutive steps in the calibration cycle or between a last step in the calibration cycle to a first step in a next calibration cycle.

4. The DAC of claim 1, further comprising a reference generator configured to:
receive a reference current; and
generate a bias voltage for a plurality of current sinks, wherein the bias voltage is driven by an amplifier.

5. The DAC of claim 1, further comprising a reference generator configured to:
receive a reference current; and
generate a bias voltage for a plurality of current sources, wherein the bias voltage is driven by an amplifier.

6. The DAC of claim 1, further comprising a reference generator comprising:
a metal-oxide semiconductor field-effect transistor (MOSFET) configured to receive a reference current, wherein a bias voltage for driving at least one current source is generated based on the size of the MOSFET;
the reference current having one selected value out of a plurality of potential values; and
the MOSFET having one selected size out of a plurality of potential sizes, wherein the selection of the MOSFET size corresponds to the selection of the reference current such that the value of the bias voltage is approximately the same for each potential current reference value.

7. The DAC of claim 1, further comprising a reference generator comprising:
a metal-oxide semiconductor field-effect transistor (MOSFET) configured to receive a reference current, wherein a bias voltage for driving at least one current sink is generated based on the size of the MOSFET;
the reference current having one selected value out of a plurality of potential values; and
the MOSFET having one selected size out of a plurality of potential sizes, wherein the selection of the MOSFET size corresponds to the selection of the reference current such that the value of the bias voltage is approximately the same for each potential current reference value.

8. The DAC of claim 1, further comprising a transimpedance output amplifier, the input of the transimpedance output amplifier coupled to each of a plurality of current-steering elements.

9. The DAC of claim 1, further comprising an integrator, the input of the integrator coupled to each of a plurality of current-steering elements.

10. A digital-to-analog converter (DAC), comprising:
a plurality of current-steering elements, wherein:
each current-steering element comprises a current source, a current sink, and a current switch, the current switch configured to couple the current source to a calibration-current sink and couple the current sink to a calibration-current source when the current steering element is being calibrated;
each respective current-steering element is configured to be calibrated during respective steps in a calibration cycle; and a control circuit configured to:
output a plurality of control signals;
direct a control signal to a first current-steering element during at least a first step in which the first current-steering element is not being calibrated; and
direct the control signal to a second current-steering element during at least a second step in which the second current-steering element is not being calibrated.

11. The DAC of claim 10, wherein at least two control signals are redirected to different respective current-steering elements during at least one transition between consecutive steps in the calibration cycle.

12. The DAC of claim 11, wherein no more than two control signals are redirected to different respective current-steering elements during transitions between consecutive steps in the calibration cycle or between a last step in the calibration cycle to a first step in a next calibration cycle.

13. The DAC of claim 10, further comprising a reference generator configured to:
receive a reference current; and
generate a bias voltage for a plurality of current sinks, wherein the bias voltage is driven by an amplifier.

14. The DAC of claim 10, further comprising a reference generator configured to:
receive a reference current; and
generate a bias voltage for a plurality of current sources, wherein the bias voltage is driven by an amplifier.

15. The DAC of claim 10, further comprising a reference generator comprising:
a metal-oxide semiconductor field-effect transistor (MOSFET) configured to receive a reference current, wherein a bias voltage for driving at least one current source is generated based on the size of the MOSFET;
the reference current having one selected value out of a plurality of potential values; and
the MOSFET having one selected size out of a plurality of potential sizes, wherein the selection of the MOSFET size corresponds to the selection of the reference current such that the value of the bias voltage is approximately the same for each potential current reference value.

16. The DAC of claim 10, further comprising a reference generator comprising:
a metal-oxide semiconductor field-effect transistor (MOSFET) configured to receive a reference current, wherein a bias voltage for driving at least one current sink is generated based on the size of the MOSFET;
the reference current having one selected value out of a plurality of potential values; and
the MOSFET having one selected size out of a plurality of potential sizes, wherein the selection of the MOSFET size corresponds to the selection of the reference current such that the value of the bias voltage is approximately the same for each potential current reference value.

17. The DAC of claim 10, further comprising a transimpedance output amplifier, the input of the transimpedance output amplifier coupled to each of a plurality of current-steering elements.

18. The DAC of claim 10, further comprising an integrator, the input of the integrator coupled to each of a plurality of current-steering elements.

19. A method, comprising:

coupling a calibration-current sink to current sources of respective current-steering elements out of a plurality of current-steering elements during respective steps in a calibration cycle;

coupling a calibration-current source to current sinks of respective current-steering elements out of the plurality of current-steering elements during respective steps in the calibration cycle;

calibrating respective current-steering elements out of the plurality of current-steering elements during respective steps in the calibration cycle, wherein at least one current-steering element is configured to:

operate as instructed by a first control signal during at least a first step in which the at least one current-steering element is not being calibrated; and operate as instructed by a second control signal during at least a second step in which the at least one current-steering element is not being calibrated; and directing respective control signals out of a plurality of control signals to the respective current-steering elements that are not being calibrated during the respective steps in the calibration cycle.

20. The method of claim 19, further comprising redirecting at least two control signals to different respective current-steering elements that are not being calibrated in a next step during at least one transition between consecutive steps in the calibration cycle.

21. The method of claim 19, wherein no more than two control signals are redirected to different respective current-steering elements during transitions between consecutive steps in the calibration cycle or between a last step in the calibration cycle to a first step in a next calibration cycle.

* * * * *